(12) United States Patent
Haugan et al.

(10) Patent No.: US 7,676,730 B2
(45) Date of Patent: Mar. 9, 2010

(54) METHOD AND APPARATUS FOR IMPLEMENTING ERROR CORRECTION CODING IN A RANDOM ACCESS MEMORY

(75) Inventors: Rodger D. Haugan, Broomfield, CO (US); Galen G. Kerber, Lafayette, CO (US); David P. Haldeman, Broomfield, CO (US)

(73) Assignee: Quantum Corporation, San Jose, CA (US)

( * ) Notice: Subject to any disclaimer, the term of this patent is extended or adjusted under 35 U.S.C. 154(b) by 1028 days.

(21) Appl. No.: 11/322,446

(22) Filed: Dec. 29, 2005

(65) Prior Publication Data

US 2007/0079217 A1  Apr. 5, 2007

Related U.S. Application Data

(60) Provisional application No. 60/722,722, filed on Sep. 30, 2005.

(51) Int. Cl.
*G11C 29/00* (2006.01)
*H03M 13/00* (2006.01)

(52) U.S. Cl. ..................... 714/769; 714/766
(58) Field of Classification Search ............... 714/766, 714/769
See application file for complete search history.

(56) References Cited

U.S. PATENT DOCUMENTS

| | | | | |
|---|---|---|---|---|
| 4,955,024 A | * | 9/1990 | Pfeiffer et al. ............ 714/763 |
| 5,052,001 A | * | 9/1991 | Jeppesen et al. ........... 714/802 |
| 5,088,092 A | * | 2/1992 | Jeppesen et al. ........... 714/802 |
| 5,117,428 A | * | 5/1992 | Jeppesen et al. ............. 714/45 |
| 6,070,262 A | * | 5/2000 | Kellogg et al. ............. 714/763 |
| 6,295,596 B1 | * | 9/2001 | Hirabayashi et al. ........ 714/762 |
| 6,353,910 B1 | | 3/2002 | Carnevale et al. |
| 6,526,224 B1 | * | 2/2003 | Kawahara et al. ........... 386/111 |
| 6,526,537 B2 | | 2/2003 | Kishino |
| 6,718,444 B1 | * | 4/2004 | Hughes ..................... 711/155 |
| 6,854,084 B2 | * | 2/2005 | Melanson et al. ........... 714/773 |
| 7,043,679 B1 | * | 5/2006 | Keltcher et al. ............ 714/763 |
| 7,085,882 B2 | * | 8/2006 | Lee et al. ................... 711/106 |
| 7,117,421 B1 | * | 10/2006 | Danilak .................... 714/763 |
| 7,165,206 B2 | * | 1/2007 | Lee et al. ................... 714/763 |
| 2004/0128464 A1 | * | 7/2004 | Lee et al. ................... 711/171 |
| 2004/0128465 A1 | * | 7/2004 | Lee et al. ................... 711/171 |

* cited by examiner

*Primary Examiner*—Joseph D Torres
(74) *Attorney, Agent, or Firm*—Baker Botts L.L.P.

(57) ABSTRACT

Apparatuses and methods for utilizing error correction code in a data buffer or data storage device. In one variation, a single memory device is utilized to store both the data and the associated error correction code. The data and the associate error correction codes are stored on separate memory banks on the memory device. The error correction code may be consolidated into one or more regions on the memory device to improve the utilization of the available memory space on the memory device. In addition, by utilizing separate memory banks to store the data and the associated error correction code, the data and the error correction code can be accessed in an overlapping manner.

27 Claims, 10 Drawing Sheets

```
===============
32MByte Buffer
===============
256Mbit, 16Mx16 DDR SDRAM
Full Buffer byte addr   24 23 22 21 20 19 18 17 16 15 14 13 12 11 10 09 08 07 06 05 04 03 02 01 00
bank addr                1  0
row addr                      12 11 10  9  8  7  6  5  4  3  2  1  0
col addr                                                              8  7  6  5  4  3  2  1  0  X Buffer byte address to physical DDR SDRAM pin connectivity;
--------------------------------------------------------------
Bank Address mapping : BA1 BA0
                        24  23
Row/Column Address mapping : A12 A11 A10 A09 A08 A07 A06 A05 A04 A03 A02 A01 A00
Row =                       22  21  20  19  18  17  16  15  14  13  12  11  10
Column =                     x   x  AP   x  09  08  07  06  05  04  03  02  01
```

```
==============
64MByte Buffer
==============
512Mbit, 32Mx16 DDR2 SDRAM
Full Buffer byte addr 25 24 23 22 21 20 19 18 17 16 15 14 13 12 11 10 09 08 07 06 05 04 03 02 01 00
bank addr                                                                           1  0
row addr              12 11 10  9  8  7  6  5  4  3  2  1  0
col addr                                                     9  8  7  6  5  4        3  2  1  0  X Buffer byte address to physical DDR SDRAM pin connectivity;
-------------------------------------------------------------------
Bank Address mapping   : BA1 BA0
                        06  05
Row/Column Address mapping : A12 A11 A10 A09 A08 A07 A06 A05 A04 A03 A02 A01 A00
Row =                       25  24  23  22  21  20  19  18  17  16  15  14  13
Column =                    x   x   AP  12  11  10  09  08  07  04  03  02  01
```

METHOD AND APPARATUS FOR IMPLEMENTING ERROR CORRECTION CODING IN A RANDOM ACCESS MEMORY

CROSS-REFERENCE TO RELATED APPLICATIONS

This application is claiming the benefit of priority to U.S. Provisional Application No. 60/722,722 entitled "METHOD AND APPARATUS FOR IMPLEMENTING ERROR CORRECTION CODING IN A RANDOM ACCESS MEMORY" filed on Sep. 30, 2005.

FIELD OF THE INVENTION

This invention is related generally to the field of error correction codes. In one aspect of the invention, apparatus and methods disclosed herein can be implemented in a data buffer to improve reliability of the system during data transfer from one device to the other.

BACKGROUND

Many of the previous generations of data storage devices had memory qualification issues with memories exhibiting single-bit errors. For example, some memory controllers use vertical or horizontal parity as an Error Detection Code (EDC) for verifying data integrity within the data buffer. Therefore, single-bit errors were fatal errors. The data buffer is used to cache customer data on read and writes to the media. The data buffer may also be used as a random access memory for the controller microprocessor, and as instruction storage for microprocessor program code.

As memory geometries continue to shrink and the operating speed/frequency of the device continue to increase, the rate of soft-errors also increases. Design implementations, where single-bit errors are fatal and can occur, are undesirable, and in some applications even unacceptable. An effective method to minimize failure rate due to soft-errors is through the utilization of an Error Correction Code (ECC).

Many of the data storage devices with ECC implementation utilize two or more separate memory chips in the data buffer: one or more for storing the data, and an additional one for storing the associated ECC. However, the use of multiple memory chips can increase cost and/or decrease operation efficiency.

Recently, devices that utilize a single chip in the data buffer to store both data and ECC have been introduced. Examples of such devices are illustrated in U.S. Pat. No. 6,353,910 entitled "Method and apparatus for implementing error correction coding (ECC) in a dynamic random access memory utilizing vertical ECC storage" issued to Carnevale, et al., dated Mar. 5, 2002, and U.S. Pat. No. 6,526,537 entitled "Storage for generating ECC and adding ECC to data" issued to Kishino, dated Feb. 25, 2003, each of which is incorporated by reference in its entirety for all purposes. Many of these devices employ "vertical" ECC that store data and ECC on a single memory device. Typically, the data and its corresponding ECC are stored as a continuous chain of bits on the memory array. Since the completed ECC codeword (data+ECC) is not typically 2N in size, memory locations within prescribe storage field in the memory that are not completely filled up by the ECC codeword are left unused, and thus, wasted. In addition, vertical ECC requires the system to perform address translations to skip over the ECC redundancy and the unused memory, in order to make the memory appear to be contiguous to the system application. This can result in lower system performance and/or inefficient use of memory resources.

Therefore, there is a need to improve ECC implementation in data buffers. In particular, the ability to improve the system operation efficiency while at the same time minimizing production cost (e.g., utilizing less components, etc.) may be particularly desirable.

SUMMARY OF THE INVENTION

Disclosed herein are apparatuses and methods for implementing ECC in a data buffer or data storage device. The apparatuses and methods may be utilized in data storage systems, computer systems, network systems, and various other systems where ECC are implemented to ensure the integrity of data stored in a memory device/chip.

In one variation, the data buffering device is configured to include a memory controller and a memory. The memory controller is operable to receive data and generate an error correction code for the data. The memory comprises at least a first memory bank and a second memory bank. The memory controller is operable to store the data in a first memory bank, and store the error correction code in the second memory bank. The data and the error correction code are stored into the memory banks in such a way that the error correction code is associated with the corresponding data. The memory can comprise two or more memory banks, and the memory controller can be designed to utilize any combination of the plurality of banks to separate the data from its associated error correction code.

In another variation, a single memory device (e.g., a DDR-SDRAM, SDR-SDRAM, DDR2-SDRAM, etc.) is implemented in a data storage device as a data buffer to store both the data and the associated ECC, where the data and the associated ECC are stored on the memory device in two separate regions in the single memory device. For example, a single DDR (Double Data Rate) memory chip (e.g., DDR-SDRAM, etc.) may be implemented to receive a plurality of data and their corresponding ECCs. The DDR memory comprises a plurality of memory banks for receiving the data to be saved on the memory chip. The data and the ECCs are stored into different memory banks in the DDR memory. In one example, a plurality of data sets are stored into memory bank number one, while their associated ECCs are stored into the memory bank number three. The banks are not necessarily dedicated only to data or ECC. For a different part of the address range, data could go into memory bank number three and it's ECC would go into another memory bank.

By separating the ECCs from their associated data sets, the data sets can be stored in a contiguous manner without the need for additional address translation steps. In addition, since the data sets and their associated ECCs are stored in separate banks, each of the data sets and its corresponding ECC can be accessed contiguously (i.e., simultaneously in a completely or partially overlapping manner in time).

One of ordinary skill in the art having the benefit of this disclosure would appreciate that various other Random Access Memories (RAM) that are configured with a plurality of memory banks can also be utilized with this invention. Furthermore, in view of this disclosure, one of ordinary skill in the art would also appreciate that two or more memory chips can be implemented in the apparatus. In one variation, two memory chips are utilized with a memory controller, where each data set is stored on a memory chip along with its associated ECC (i.e., the ECC is stored in the same memory chip as its associated data, but in a different bank).

Another aspect of the invention includes methods for preserving data integrity of data stored in a data buffer utilizing an error correction code. In one variation, the method comprises receiving a data, generating an error correction code, storing the data in a first memory space in a memory array of a memory module, and storing the error correction code in a second memory space in the memory array of the memory module, wherein the error correction is associated with the data, and the first memory space and the second memory space are non-contiguous within the memory array. In one implementation, a memory controller is utilized to receive the data, generate the error correction code, and store the data and the error correction code in the memory spaces in the memory. The memory may comprise a plurality of memory banks, such that the data and the ECC are stored in separate memory banks.

Once the data is stored in the memory of the data buffer, the data can later be extracted from the data buffer through accessing these memory spaces (e.g., memory banks). In one variation, the method further comprises extracting the data from its corresponding memory space, extracting the error correction code from its corresponding memory space, and checking the integrity of the data based on the error correction code. If an error is detected in the data, the memory controller may utilize the error correction code to correct the data.

These and other embodiments, features and advantages of the present invention will become more apparent to those skilled in the art when taken with reference to the following more detailed description of the invention in conjunction with the accompanying drawings that are first briefly described.

DETAILED DESCRIPTION OF THE INVENTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

A magnetic tape drive is used herein as an example application for utilizing ECC with a memory having a plurality of memory banks, in order to illustrate the various aspects of the invention disclosed herein. In light of the disclosure herein, one of ordinary skill in the art would appreciate that the methods and apparatuses disclosed herein can be implemented in various memory storage components or data buffering apparatuses that utilizes ECC to ensure the integrity of data stored in the memory. For example, the methods and apparatuses disclosed herein can also be implemented in various other data storage systems (e.g., hard drives, optical drives, etc.) to provide data protection. In another example, network routers that implement ECC in the data buffering process may also take the advantage of the methods and apparatuses disclosed herein to achieve efficient ECC utilization. In yet another example, the methods and apparatus disclosed herein can be used with the memory controller for the main memory of a low cost single DRAM personal computer.

It must also be noted that, as used in this specification and the appended claims, the singular forms "a," "an" and "the" include plural referents unless the context clearly dictates otherwise. Thus, for example, the term "a transducer" is intended to mean a single transducer or a combination of transducers, "an electrical signal" is intended to mean one or more electrical signals, or a modulation thereof.

In one example, the memory apparatus comprises a DDR memory controller logic, within an ASIC (Application-Specific Integrated Circuit), that takes advantage of the "burst" nature of DDR memory and the fact that DDR memory contains multiple banks. The memory controller implements an ECC codeword that is 34 bytes long. The ECC codeword consists of 2 bytes of ECC (i.e., ECC redundancy bytes) and 32 bytes of data. The memory controller stores the ECC codeword onto the DDR memory through two 16 byte DDR Bursts, which transfers the 32 bytes of data, and a 2 byte DDR Burst, which transfer the 2 bytes of ECC.

Figure 1:
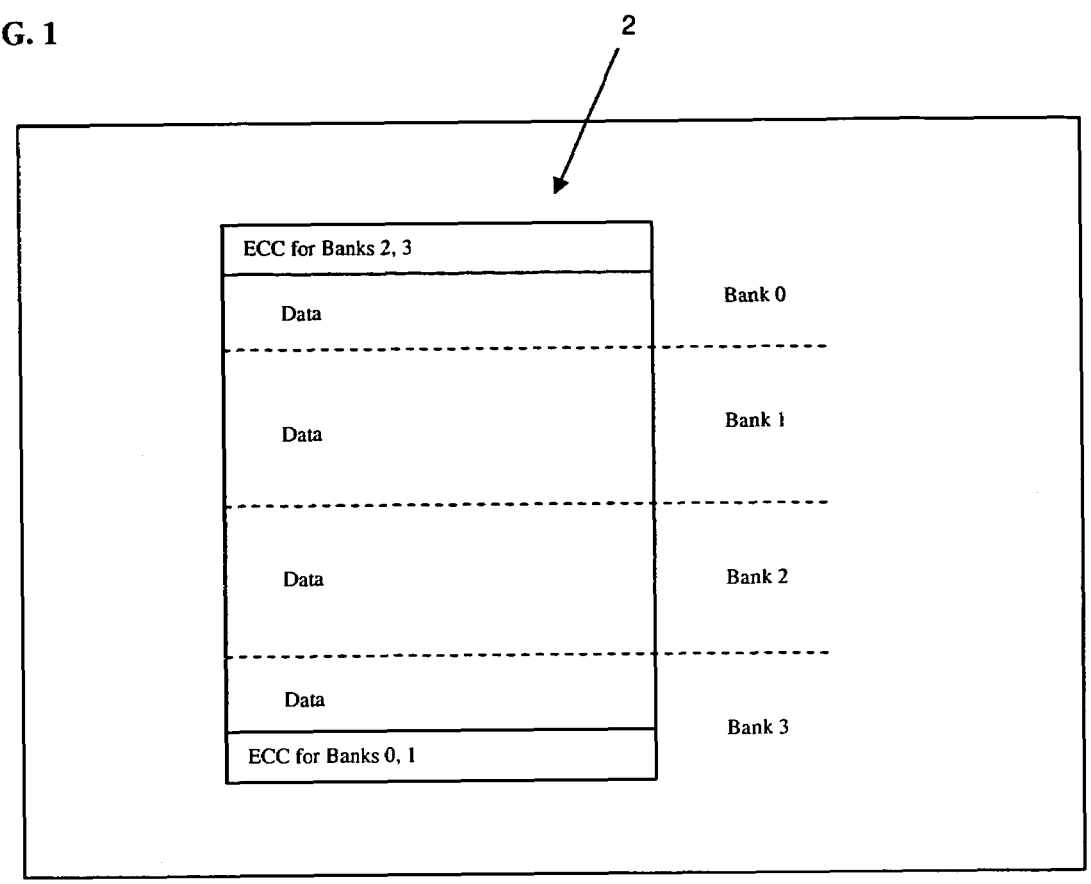
FIG. 1 illustrates one example of memory space allocation for storage of data and their associated ECCs in separate memory banks.

The ECC (i.e. ECC redundancy bytes) are stored within the same memory IC (Integrated Circuit) as the data, but in a separate "BANK" from the data bytes, at an address calculated (e.g., address translation) by the memory controller. FIG. 1 illustrates one configuration for the storage of data and their associated ECCs in a memory 2. The data in Banks 0 and 1 have their associated Burst ECC in Bank 3. The Data in Banks 2 and 3 have their associated Burst ECC in Bank 0. In this example, the ECC for the data stored in Banks 0 and 1 are consolidated in a single region within Bank 3. The consolidation of the 2 byte ECCs in an isolated region on the memory IC allows one to maximize the use of storage space within the DDR memory. For example, sixteen different 2 byte ECCs can be stored in a 32 byte pre-allocated data storage space. Similarly, the ECC for the data stored in Banks 2 and 3 are consolidated in a single region within Bank 0.

DDR memory is designed with multiple internal BANKS to allow hiding the command latency of the device. To perform a read or a write to a given address, the memory controller first issues an ACTIVATE command followed by a READ or WRITE command before data can be transferred between the memory controller and the DDR memory. In a memory device with only a single BANK, this is a serial operation. As a result, there will be a number of clock cycles that data is not transferred while the commands are sent to the DDR memory. This lowers data transfer bandwidth between the memory controller and the DDR memory. By having multiple BANKS, it allows the addressing commands for BANK A to be sent while data transfers are in process for BANK B. Thus, "hiding" some portion of the DDR command latency.

In one variation, the DDR Memory Controller logic writes the data to the first bank of the memory and then calculates a location for the ECC redundancy in the second bank of memory. By storing the ECC redundancy in the second bank, using the algorithm below, the controller allows the data to be stored contiguously at the absolute location addressed by the Memory Controller. The ECC redundancy is stored at an indirect location that is calculated automatically by the Memory Controller logic.

For a 32 MByte memory, the Memory Controller calculates the location of the BurstECC for each data burst as follows:

If the data address is within banks 0 or 1 then the BurstECC address is determined by the following equation:

$$[(Data\_address-S/(R*2))/R]+[S-S/(R*2)]$$

If the data address is within banks 2 or 3 then the BurstECC address is determined by the following equation:

$$[(Data\_address-(S/2))/R]$$

Where;
S=Size of the memory (ex. 32 Mbytes)
R=Ratio of Data_Bytes to ECC_Bytes (ex. 32/2=16)

In one variation, the SEC/DED (Single Error Correcting/Double-Error Detecting) Hamming code is utilized to protect 32 bytes, or 256 bits, of data from a single bit error. To do this with two bit error detect, only 10 redundancy bits are necessary. Where $2^n-1>256$, if n=9, then $2^9-1=511$ which is greater than 256. However in this example, there are 16 bits available in the location where the ECC redundancy is stored. If one uses 15 for n (15:0 is 16 bits) then $2^{15}-1=32,767$ bits. This can be useful since one can "shorten" the code to 256 bits which allows one to create very efficient parity (XOR) trees to generate the ECC redundancy. Instead of 10 outputs (n=9) the shortened code has 16 outputs (n=15), the parity trees are wide and shallow rather than narrow and deep. The generator polynomial with 2 bit detect for the ECC, G(f), is shown below.

Irreducible polynomial selected=$X^{15}+X^{10}+X^5+X^4+X^2+X+1$ $G(f)=(X+1)(X^{15}+X^{10}+X^5+X^4+X^2+X+1)=X^{16}+X^{15}+X^{11}+X^{10}+X^6+X^4+X^3+1$ By separating data and Burst ECC BANKS, one or more of the following benefits may be realized: (1) maximizes memory bandwidth, because DDR commands can be overlapped to allow contiguous data and Burst ECC transfers to the DDR memory, therefore, a read or write operation including ECC (i.e., ECC redundancy bytes), may take only one clock cycle longer than the same operation would take without the ECC redundancy; (2) minimizes locations within single DDR memory that are unavailable for data use by sacrificing only a small fraction of available memory for the ECC codewords, 1/16 in this particular example (redundancy bytes/[data bytes+redundancy bytes]); (3) eliminates any extra DDR memory ICs for ECC redundancy storage, since ECC and data can be stored on the same chip instead of two separate chips (which may decrease manufacturing cost); (4) provides a contiguous data memory address range with no address translation required (simplifies memory controller design, increasing maximum operational frequency), since ECC are not stored next to their associated data, the data are stored in the BANKs one after the other in the memory array, thus the data can utilize contiguous memory address range.

In addition, the apparatus may be configured such that when the memory requests are less than a DDR "burst", the memory controller automatically performs the required read-modify-write operation to maintain the correct "Burst ECC" in the DDR memory, and maintain the random access nature of the random access memory device to the application.

In another example, the ECC data buffer is implemented in a data storage system 12. The data storage system comprises a magnetic tape drive 14 and a host computer 20. The tape drive 14 includes an ASIC (Application Specific Integrated Circuit) 16 which includes a data buffer memory controller 18. The data buffer memory controller 18 is utilized to buffer data between the host computer 20 interface and the data storage tape interface logic 22. In this particular example, the memory controller 18 incorporates a SEC/DED (Single Error Correct/Double Error Detect) Hamming ECC data integrity scheme for protecting the data while it resides in the data buffer. This ECC is transparent to the rest of the tape drive sub-system. One of ordinary skill in the art having the benefit of this disclosure would appreciate that other error correction code schemes, such as DEC/TED (Double Error Correcting/Triple Error Detecting) BCH code, or Reed-Solomon Code, can also be utilized in place of the Hamming ECC.

Figures 2, 3:
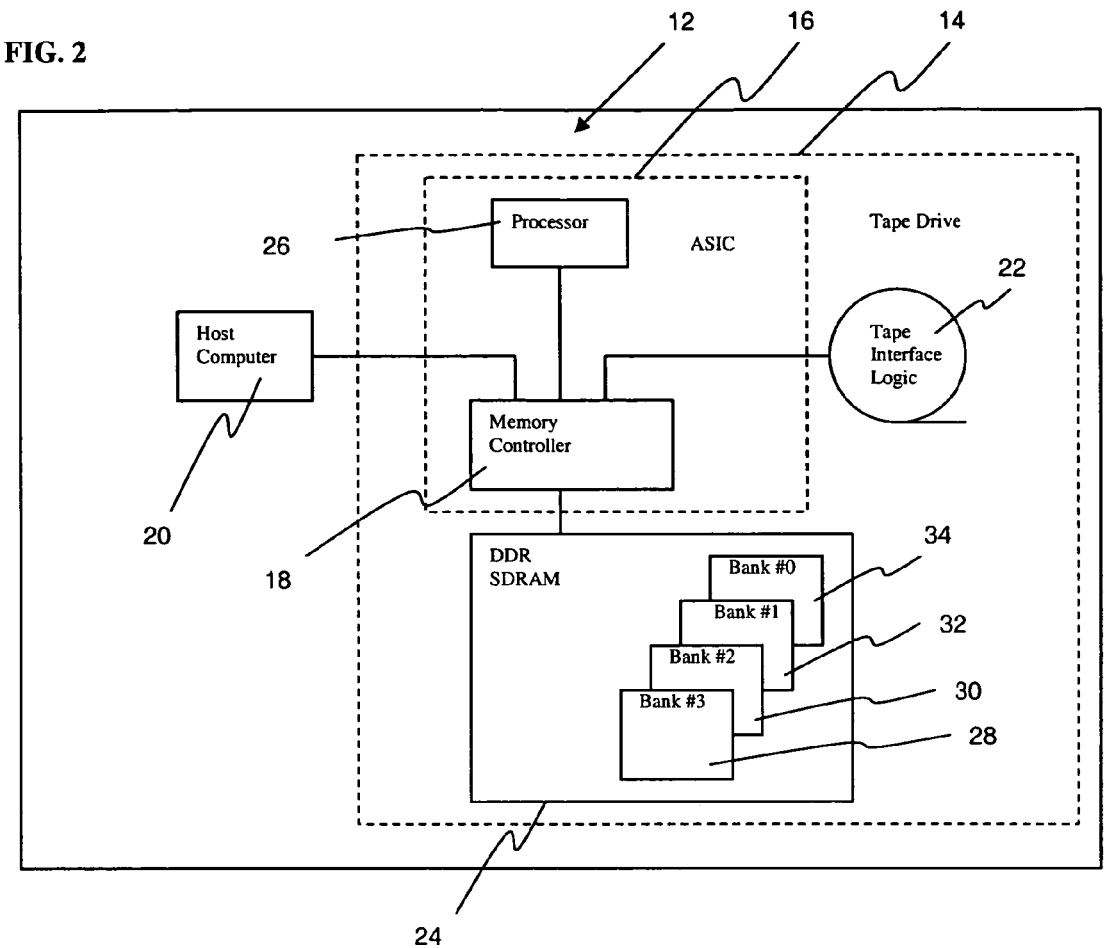
FIG. 2 is a block diagram illustrating an example of a data storage drive with an ECC data buffer. The relationship between the data buffer (DDR-SDRAM), the memory controller, the host computer, and the tape interface logic are shown.
FIG. 3 is a table illustrating one example of the mapping of the address received from the data buffer user logic into a physical address for storage of ECC into the DDR memory.

In this example, the ECC is designed to protect "bursts" of 32 Bytes within the data buffer. Each 32 Byte burst of data is protected by a 2 Byte "BurstECC" (i.e., ECC). FIG. 2 shows a block diagram illustrating the relationship between the data buffer (DDR-SDRAM) 24, the memory controller 18 within the tape drive, and the attached host computer.

To transfer data from the host computer 20 to the tape in the tape drive 14, the data is first transferred from the host computer 20 to the memory controller 18. The operation of the memory controller is managed by a processor 26. The memory controller 18 controls the flow of data from the host computer 20 to the tape interface logic 22 by utilizing the DDR-SDRAM 24 to buffer the flow of data and prevent overflow. For each set of data (e.g., 32 bytes) received by the memory controller 18, the memory controller 18 generates an ECC (e.g., 2 bytes of ECC redundancy). In this particular implementation, a DDR-SDRAM 24 having four separate banks 28, 30, 32, 34 is implemented as the data storage area of the data buffer. The memory controller 18 transmits the data into a first bank, which is one of the four available banks, in the DDR-SDRAM 24, and then transmits the ECC into a second bank, which is one of the three remaining banks. As the result, the data and its associated ECC are saved in two separate banks. However, depending on the design, the two banks can be of various combinations, and are not limited to the two adjacent banks. For example, the data may be stored in Bank #2 30 while the associated ECC is stored in Bank #0 34.

In addition, the data and the ECC can be transferred serially one after the other, or contiguously, such as simultaneously in an overlapping manner. Since the data and the ECC are to be stored in separate banks, where each of the banks can be accessed by the memory controller independently, it is possible to begin addressing the ECC bank while the transfer of the data bank is in progress. Furthermore, since storage of data within the memory is contiguous without ECC codes interleaved between the data, the address for the storage of a series of corresponding data can be mapped directly into the memory without the need for an address translation step. To store the associated ECCs, hardware address translation (implemented within the memory controller) can be utilized to assign the addresses for storing the associated ECCs in a separate bank.

When the process determines that the tape interface logic is ready to receive the data, the data and its associated ECC are then extracted from the corresponding banks in the DDR-SDRAM by the memory controller. As discussed earlier, since the plurality of banks can be accessed independently of each other, the data and the associated ECC, which are stored in different banks, can be extracted either serially or contiguously (e.g., simultaneously in an overlapping manner): In this example, the ECC and the associated data are accessed simultaneously in an overlapping manner to facilitate the rate of transfer. The memory controller then utilizes the ECC to check the integrity of the data (i.e., determine if there are error in the data). In the event the memory controller determines there is an error, the memory controller may further utilize the ECC to correct such error. Error may appear in the data saved on the DDR-SDRAM due to various factors, such as noise and/or hard/soft error caused by the memory hardware itself. Once the data has been checked and/or corrected, the ECC is discarded, and the data is transmitted to the tape interface logic, which places the data onto the magnetic tape through a transducer (e.g., electro magneto tape drive head).

To transfer customer data from the magnetic data storage tape in tape drive to the host computer, a process similar to the one described above is utilized in a reversed manner. The data on the magnetic tape is captured by the transducer and then transferred to the memory controller, the memory controller then generates an ECC for the data and then save the data and the associated ECC in two separate banks in the DDR-SDRAM. When the processor determines that the host computer is ready to receive the data, the memory controller extracts the data and its associated ECC from their corresponding banks, either serially or contiguously. Again, in this particular example, the data and its associated ECC are extracted simultaneously in an overlapping manner. The memory controller then checks the integrity of the data and/or correct any error based on the ECC. Thereafter, the data is transferred from the memory controller to the host computer.

Details of the technical implementation for this example are described below. One of the features of the DDR memory is the fact that the address space within the memory is partitioned into multiple "banks". These banks are selected as part of the address for every location within the memory. Every memory location resides in a single bank and can be accessed by issuing commands to Activate (open), Read or Write and then Precharge (close) that bank.

The full address for a given location is broken down into 3 components: Bank, Row, and Column. Bank—Typical DDR devices have either 4 or 8 internal banks. This means that there are either 2 or 3 address bits for bank selection. Row—This portion of the address is passed to the DDR memory in the Activate command and determines "row" that will be opened and available for access with the memory controller. The number of row address bits varies depending upon DDR density and is defined by industry standards. Column—This portion of the address is passed along with the Read or Write command and determines the "column" within the opened "row" that addresses the exact starting address for the data transfer. The number of column address bits varies depending upon DDR density and is defined by industry standard. The "commands" to open a row (Activate) and access (Read/Write) data would be before the data transfer to those locations can take place. Also to access a location in another row of the same bank requires that the bank be closed (PRECHARGE) taking additional clock cycles.

By using the "bank" feature of the DDR-SDRAM, it is possible for the memory controller to "overlap" these command operations for the multiple banks. Thus, effectively "hiding" this command overhead for each bank and more efficiently utilizing the memory transfer bandwidth. The BurstECC memory controller uses the "bank" feature of DDR-SDRAM to "hide" the command overhead required for the BurstECC accesses.

The BurstECC memory controller in this particular example is configured as follows: (1) The apparatus implements a SEC/DED ECC data protection scheme within a single, 16 bit wide external DDR-SDRAM. (2) The BurstECC scheme is transparent to all the logic that uses the data buffer (i.e., BurstECC has meaning only to the memory controller), and all other users of the data buffer can not see its implementation. BurstECC is generated, checked and managed strictly within the memory controller itself. Therefore, any write data access to the data buffer that is less than the data "burst" size, requires the memory controller logic to automatically perform a read/modify/write operation of the addressed data burst and its associated BurstECC location.

Since DDR-SDRAM memory is efficient when data is transferred in bursts, in one variation, the apparatus is configured such that the memory controller logic group data transfers into bursts of 32 Bytes. This 32 Byte data size is a balance between maximizing the DDR interface memory bandwidth (choose a large burst size per DDR command operation) and dividing the data buffer bandwidth among multiple users of the data buffer (choose a small burst size to limit user latency to data buffer). The 32 Byte data burst also works well with the SEC/DED Hamming ECC code that is implemented in the memory controller. A single 16 bit (2 Byte) location is used to hold the BurstECC for its associated 32 Byte data burst. There will therefore be a 34 Byte ECC Codeword: 32 Bytes data and 2 Bytes ECC (i.e., ECC redundancy). As one of ordinary skill in the art having the benefit of this disclosure would appreciate, various other burst size for data and BurstECC could also be utilized depending upon throughput and ECC type requirements.

In order to maximize the amount of memory available in the data buffer for storing user data, one can minimize the amount of the physical DDR memory used for overhead. This overhead can consist of two types: (1) memory locations used for ECC (i.e., BurstECC), and (2) "Unused" memory locations that are not utilized for either data or ECC and become unavailable due to data storage pattern.

With a data burst size of 32 Bytes and a BurstECC size of 2 Bytes, the minimum possible amount of memory given to overhead will be:

$$2 \text{ Bytes}/(2 \text{ Bytes} + 32 \text{ Bytes}) = 2/(2+32) = 1/17 \text{ of the total memory size}$$

As one of ordinary skill in the art having the benefit of this disclosure would appreciate, variations of this design implementation can choose to use more of the memory for the BurstECC. The above equation illustrates the required amount of the memory that is devoted to BurstECC, which is the theoretical minimum overhead for a data burst size of 32 Bytes and a BurstECC size of 2 Bytes.

In this example, every user of the data buffer (i.e., other components communicating with the data buffer) is configured to present a full 25 bit address to the memory controller when it requests a data access. This allows the user to address any location within the 32 Mbyte physical memory range. As one of ordinary skill in the art having the benefit of this disclosure would appreciate, address with a larger or smaller number of bits can be utilized depending on the size of the memory being implemented. In this particular implementation, the data buffer is 32 Mbytes total with 30 Mbytes available for user data. This means that 2 Mbytes (or 1/16 of total memory) will be used for overhead (BurstECC and unused). This particular design is configured with memory allocation of 1/16 instead of the 1/17 overhead point to simplify Controller implementation.

The address received from the data buffer user logic is mapped onto the physical address given to the external DDR memory by the memory controller logic. This mapping 42 is shown in FIG. 3 for a 32 Mbyte density case in the memory controller. The partitioning of data buffer user address (logical) to physical (DDR) address for this specific example is illustrated. In this implementation, there is no need for the bank address bits to be the most significant bits of the logical address.

Figure 4:
FIG. 4 is a table illustrating another variation of address partitioning scheme utilized by a memory controller.

In another variation, the memory controller implements the address partitioning scheme 44 shown in FIG. 4. FIGS. 3 and 4 illustrate implementations for DDR memories that have 4 internal banks. For DDR memories that have 8 internal banks, the third bank select bit may be grouped with the other two shown in FIGS. 3 and 4.

The "bank" architecture of DDR-SDRAM allows the partition of the BurstECC portion and data portion of the 34 Byte ECC Codeword, by storing the 2 Byte BurstECC and the 32 Byte DataBurst in separate banks.

By separating data and ECC in different banks the implementation can realize one or more of the following benefits: (1) Maximizes memory bandwidth because DDR commands can be overlapped to allow contiguous data and BurstECC transfers to the DDR memory. A read or write operation including ECC redundancy bytes takes only a few clock cycles longer than the same operation would take without the ECC redundancy. (2) Allows minimizing the number of locations within DDR memory that are unavailable for data use by sacrificing the lowest possible fraction of available memory for the BurstECC redundancy bytes. Unusable locations in the memory can occur if the total physical DDR memory size is not a multiple of the ECC Codeword size (34 bytes in this example). However, as illustrated herein, codeword size can be selected to minimize the unusable memory locations. For this particular 32 Mbyte data buffer design it is:

a. 33,554,432 TotalMemoryBytes/34 BytesPerCodeWord=986,895.058823 CodeWordsIn TotalMemory b. 0.058823*34 Bytes=2 Bytes Unusable in TotalMemory (3) Allows for a contiguous data memory address range with no data area address translation required (simplifies memory controller design, increasing maximum operational frequency). Knowing that the data address is un-translated and that all data bytes are contiguous, has benefits in debugging at the hardware level and in using software debugger tools to display blocks of memory. (4) Eliminates any extra DDR memory ICs for ECC redundancy storage, since the data and BurstECC reside in the same physical DDR-SDRAM. These and other benefits are further illustrated below.

In one variation the memory controller takes the data buffer user data address, uses it directly to position the data within the Data area of the physical DDR memory and then uses the data address to calculate (translate) the location of the BurstECC redundancy bytes within the physical DDR memory.

Figure 5:
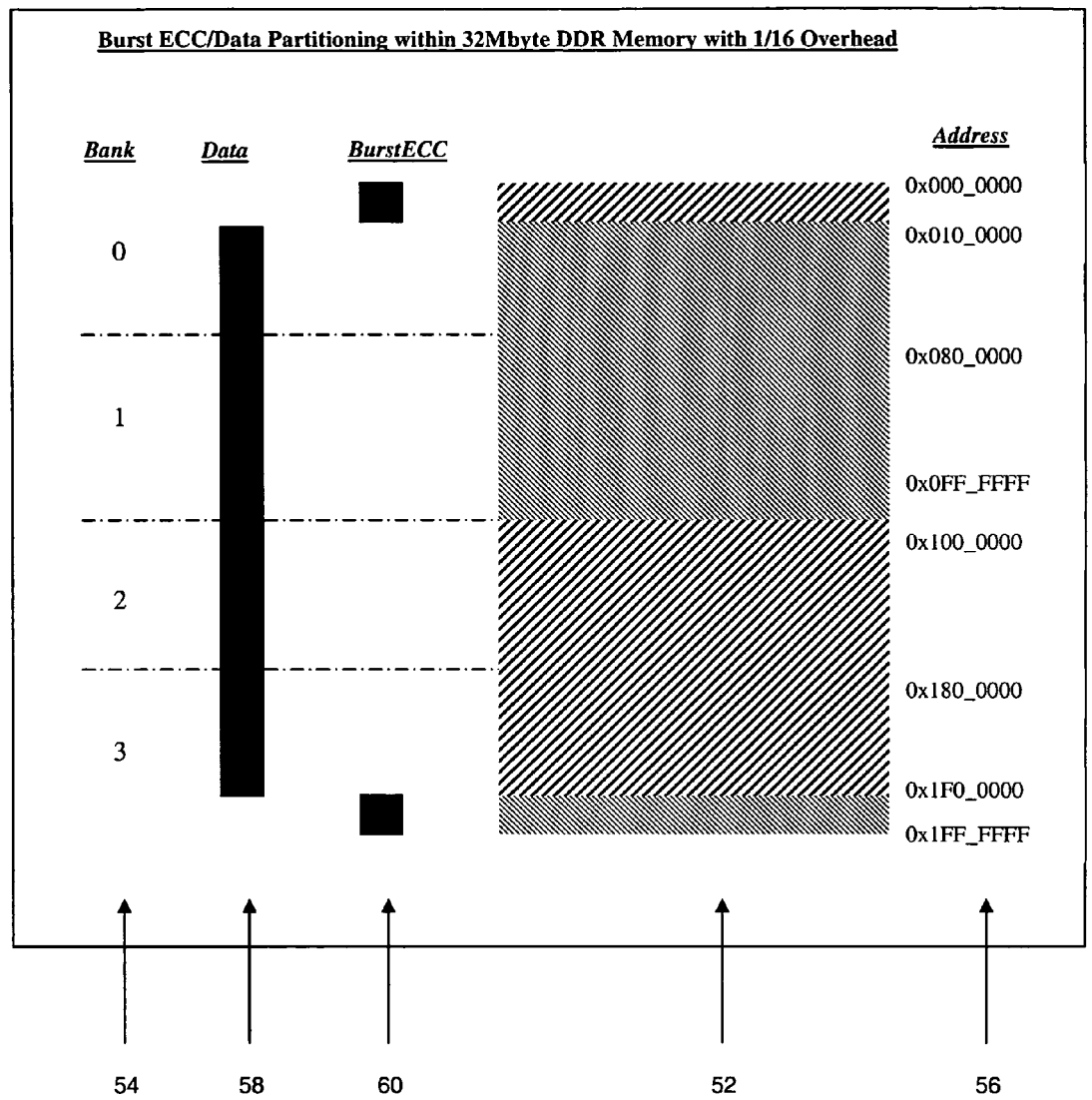
FIG. 5 illustrates an example for ECC/Data partitioning within a 32 Mbyte DDR memory implementing a $\frac{1}{16}$ overhead scheme.

FIG. 5 illustrates this partitioning within the DDR memory for one example of the data buffer implementation. Since this data buffer implementation uses the two most significant bits of address for the bank selection, it is easy to see how the physical memory 52 is partitioned into the four banks 54. To even further simplify the memory controller design, an implementation with the BurstECC at 1/16 overhead can be utilized, as shown in FIG. 5.

Since the total memory size is 32 Mbytes, when divided into two equal data (16 Mbytes) and BurstECC areas, the size of each BurstECC area at 1/16 overhead will be:

[(Total_memory_size/Number_of_BurstECC_areas)/16]=[(32 MB/2)/16]=1 MB=0x010_0000

Also, this particular data buffer implementation chose to define the BurstECC Codeword size as 32 Bytes_data and 2 Bytes_BurstECC_Redundancy=34 Bytes. So, for every 32 Byte burst of data there will be 2 Bytes of BurstECC. It is possible to use the Data_address divided by 16 to get an offset for the BurstECC address. Thus the memory controller calculates the location of the BurstECC for each data burst as follows:

If the data address 56 is within banks 0 or 1, then the BurstECC address is determined by the following equation:

[(Data_address−0x010_0000)/0x10]+0x1F0_0000

If the data address 56 is within banks 2 or 3 then the burstECC address is determined by the following equation:

[(Data_address−0x100_0000)/0x10]

Referring to FIG. 5, the Data "area" 58 of the physical DDR memory is between two smaller BurstECC areas 60 that reside at the beginning and end of the physical DDR memory. If data resides in Banks 0 or 1 then its associated BurstECC will reside in Bank 3. If data resides in Banks 2 or 3 then its associated BurstECC will reside in Bank 0. This allows the memory controller to overlap the DDR command operations for the data and BurstECC transfers. The 1/16 overhead implementation yields 64 Kbytes of unused location for each of the BurstECC areas for a total Unused of 128 Kbytes for the total memory.

Figure 6:
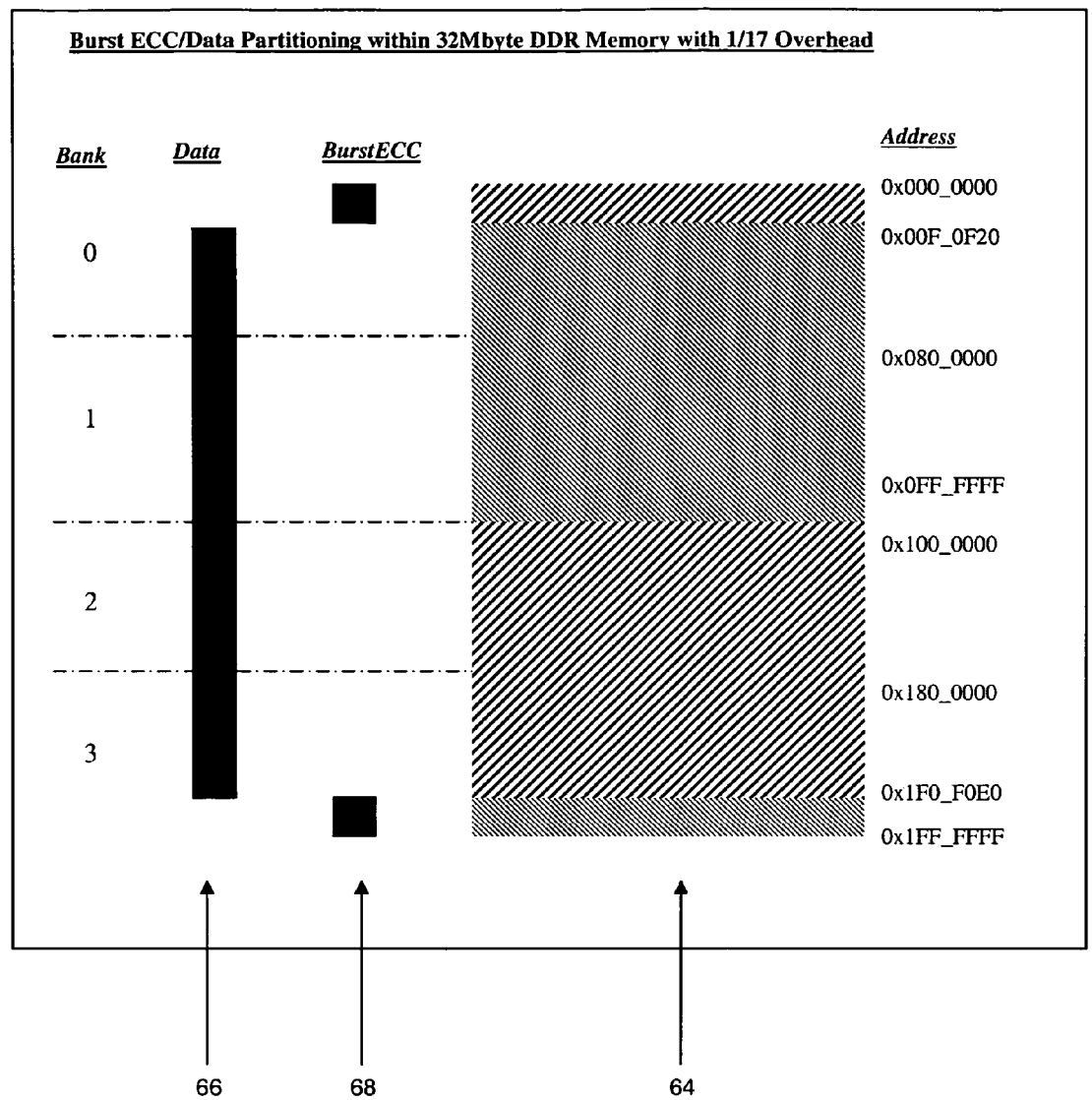
FIG. 6 illustrates another variation for ECC/Data partitioning within a 32 Mbyte DDR memory, which implements a $\frac{1}{17}$ overhead scheme.

In another variation, a data buffer implementation of 1/17 overhead is implemented with a memory allocation 64 having dual BurstECC areas, as shown in FIG. 6. Since this implementation uses the two most significant bits of address for the bank selection, it is easy to see how the physical memory is partitioned into the four banks.

The total memory size is 32 Mbytes, divided into two equal data (16 Mbytes) and BurstECC areas, the size of each BurstECC area at 1/17 overhead will be:

[(Total_memory_size/Number_of_BurstECC_areas)/17]=[(32 MB/2)/17]=986,895.058823

This number rounded up to the next 32 Byte boundary is 986,912=0x00F_0F20

Keeping the BurstECC Codeword size as 32 Bytes_data and 2 Bytes_BurstECC_Redundancy=34 Bytes. So, for every 32 Byte burst of data there will be a 2 Bytes of BurstECC. It is possible to use the Data_address divided by 16 to get an offset for the BurstECC address.

Thus, this variation of the 1/17 overhead memory controller for the data buffer calculates the location of the BurstECC for each data burst as follows:

If the data address is within banks 0 or 1, then the Burst-ECC address is determined by the following equation:

[(Data_address−0x00F_0F20)/0x10]+0x1F0_F0E0

If the data address is within banks 2 or 3, then the Burst-ECC address is determined by the following equation:

[(Data_address−0x100_0000)/0x10]

As illustrated in FIG. 6, the Data "area" 66 of the physical DDR memory is between two smaller BurstECC areas 68 that reside at the beginning and end of the physical DDR memory. If data resides in Banks 0 or 1 then its associated BurstECC will reside in Bank 3. If data resides in Banks 2 or 3 then its associated BurstECC will reside in Bank 0. This allows the memory controller to overlap the DDR command operations for the data and BurstECC transfers.

The data buffer with 1/17 overhead implementation yields 18 Bytes of unused location for each of the BurstECC areas for a total Unused of 36 Bytes for the total memory. This example illustrates how the scheme of separating the Data and BurstECC into separate Banks of the RAM can significantly improve the utilization of the total memory without negatively impacting memory performance.

Figure 7:
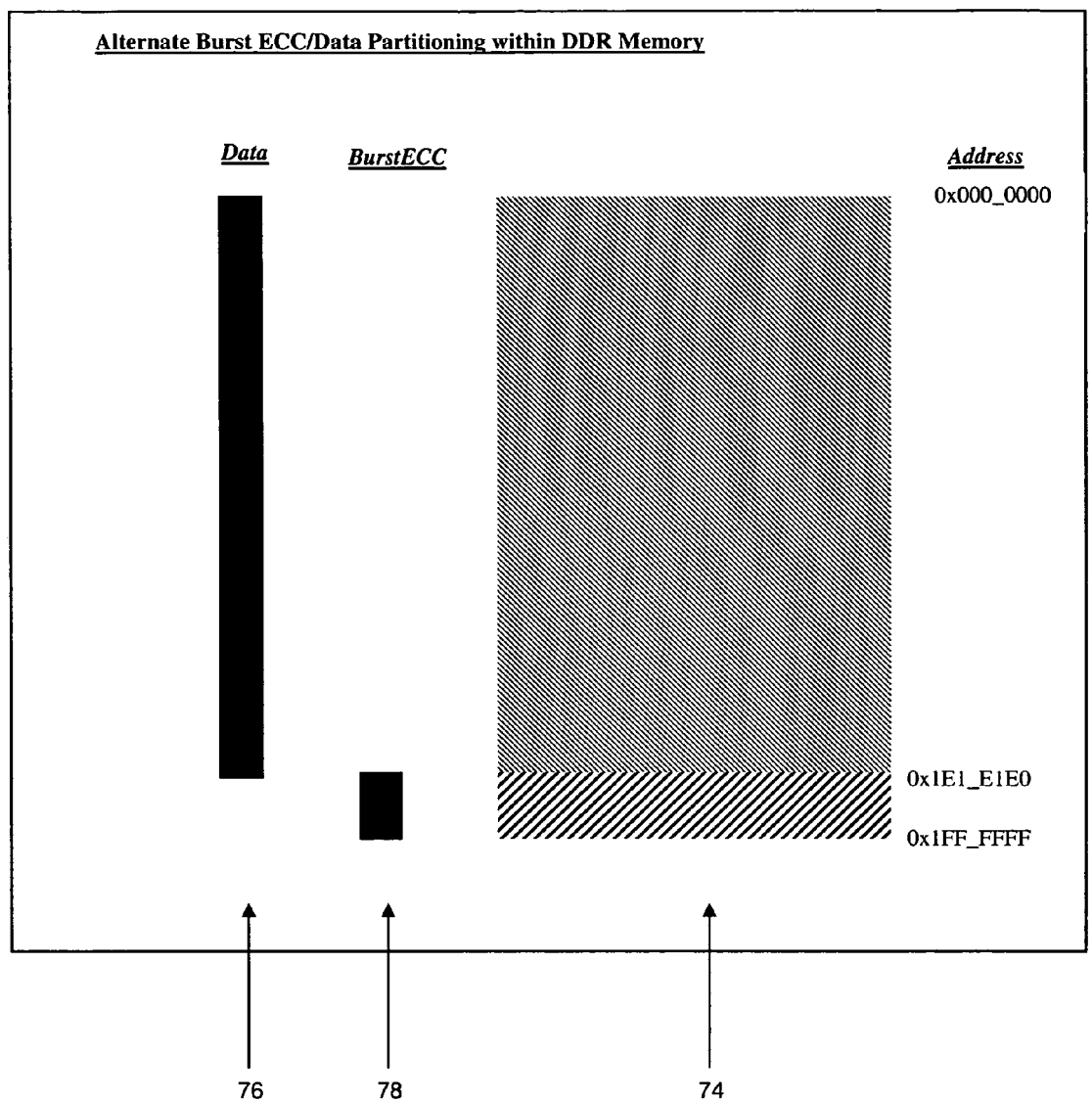
FIG. 7 illustrates yet another variation for ECC/Data partitioning. In this example, a single region within the memory is dedicated for ECC storage.

Referring to FIG. 7, another variation that utilizes a single ECC storage area 74 is illustrated. It is not necessary for the memory to be partitioned with the data area between two ECC storage areas. As an example, the memory controller is configured to partition the physical random access memory as shown in FIG. 7. Since the ECC (i.e., redundancy bytes) are separated from the data, they can be grouped and placed anywhere within the memory. An added benefit of a single ECC area is that it may yield a low overhead (e.g., minimize unused number of Bytes).

In this particular example, the memory controller utilizes the memory with partitioning of physical memory as illustrated in FIG. 7. This implementation retains the key feature of the implementations described above, in that the data buffer user address is used directly for the Data_address (no mapping required), and all the address translation takes place during BurstECC address generation.

This particular implementation places the Bank select bits lower within the full address and requires more complex address translation for the ECC address generation. If the BurstECC falls into the same bank as the data burst the bank address bits are manipulated to put it into a different bank, via a method that makes the BurstECC address unique for each data burst. But, since the BurstECC address is not used immediately, the pipelining of this more complex BurstECC address generation can be hidden within the Data phase command and transfer overhead.

Since the total memory size is 32 Mbytes, divided into single Data and BurstECC areas the size of the BurstECC area at 1/17 overhead is:

[(Total_memory_size/Number_of_BurstECC_areas)/17]=[(32 MB/1)/17]=1,973,790.117647

This number is rounded up to the next 32 Byte boundary is 1,973,792=0x01E_1E20

Keeping the BurstECC Codeword size as 32 Bytes_data and 2 Bytes BurstECC_Redundancy=34 Bytes. So, for every 32 Byte burst of data there will be a 2 Bytes of BurstECC.

As illustrated in FIG. 7, the Data "area" 76 of the physical DDR memory 74 starts at the top of the physical DDR memory with a single Burst ECC area 78 at the end of the physical DDR memory. This variation yields 2 Bytes of Unused locations for the total memory. This represents an very efficient utilization for this physical memory size, as the unused number of bytes is less than the ECC Codeword size of 34 Bytes.

Because the data and ECC are in separate banks of the DDR memory, it allows the command operation of the ECC transfer to overlap the data transfer. This increases DDR memory bandwidth and may negate any performance impacts associated with separating the Data and ECC into separate DDR banks.

Figure 8:
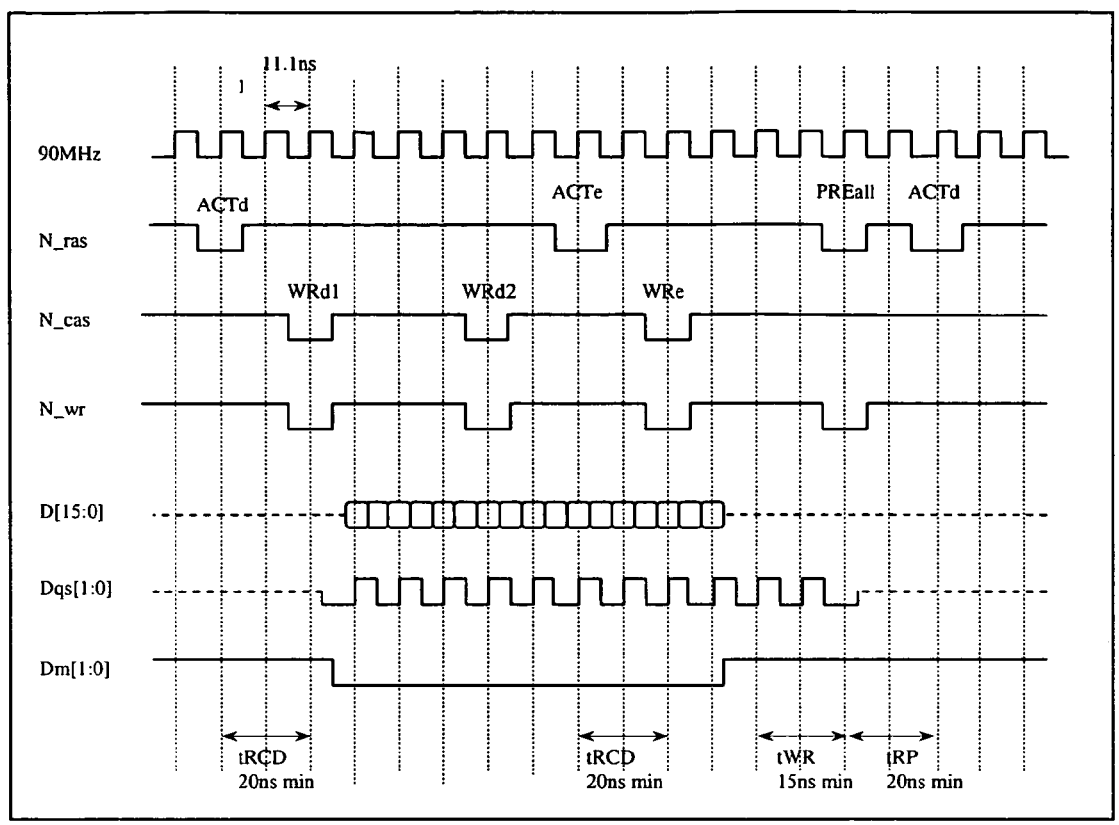
FIG. 8 is a timing diagram illustrating an example for writing data and ECC onto a DDR-SDRAM in an overlapping manner. In this example, write bursts of 32 bytes of data and 2 bytes of ECC are implemented.

FIG. 8 is a timing diagram illustrating one example where an Activate command for the BurstECC transfer (ACTe) is overlapped with the operation of the Write data command (WRd2) so that the transfer phases are contiguous on the DDR interface.

Figure 9:
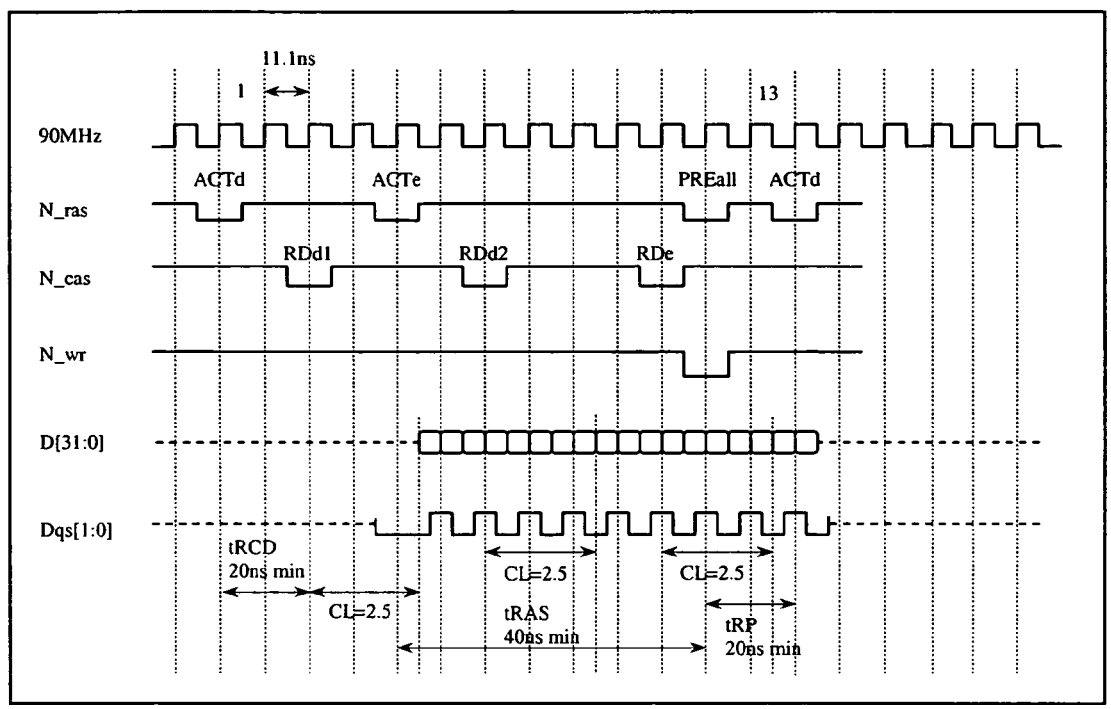
FIG. 9 is a timing diagram illustrating an example for reading data and ECC from the DDR-SDRAM in an overlapping manner. In this example, read bursts of 32 bytes of data and 2 bytes of ECC are implemented.

FIG. 9 is a timing diagram illustrating an example of a DDR-SDRAM interface read burst operation. Two ACT with two BL=8 RD bursts to same bank/row, single BL=8 RD burst to ECC bank/row, PRE(all) interrupts ECC read and closes both banks. Then another ACT is applied to start next operation.

Figure 10:
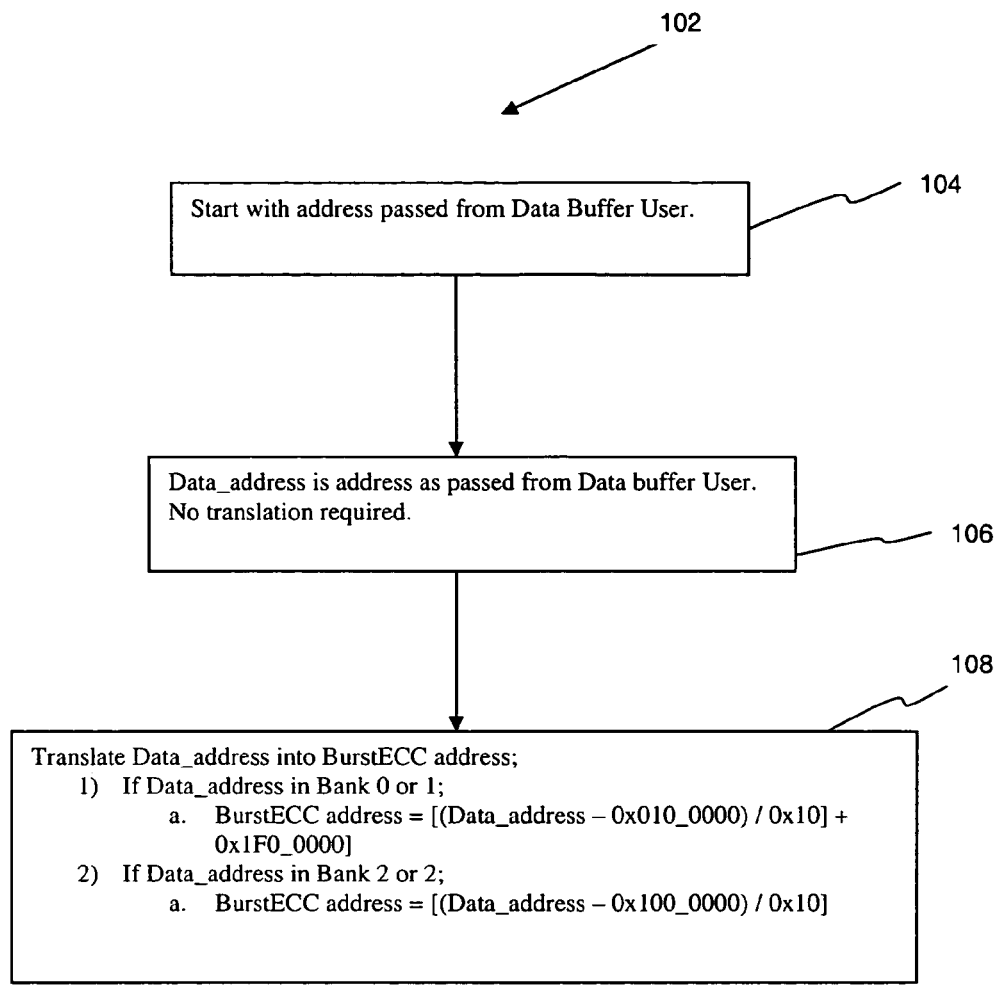
FIG. 10 is a flow chart illustrating one example of the memory controller's data and ECC address generation flow.

Referring to FIG. 10, a diagram 102 is provided to illustrate an example of the steps to be performed by the memory controller. The memory controller determines the address for the data and the associated ECC within the physical DDR memory, then utilizes these addresses to place the data and the ECC into their corresponding positions within the banks of the memory. As shown in FIG. 10, the data buffer user indicates to the memory controller where to place the data (i.e., address passed from the data buffer user) in the memory 104. The memory controller utilizes the data address provided by the data buffer user (i.e., Data_address) for placement of the data into the memory 106. The memory controller then takes the data address and translates it, and generates an address (BurstECC address) for the associated ECC 108. The ECC generated by the memory controller can then be placed into the corresponding BurstECC address.

As discussed above, by using the feature of multiple banks in advanced RAM to allow separation of the data and ECC in the external memory of the buffer, memory apparatus can be designed with various performance improvements. For example, variations of the apparatus can be configured to allow for separate address translation upon the ECC address alone. This permits the ECC redundancy bytes to be grouped together and placed anywhere within the physical memory space. As a result, the ECC redundancy bytes can reside contiguously in the physical DDR memory with no "unused" locations between them. Therefore, the design does not have to waste memory by leaving memory locations unused at each page boundary, which typically happens in a "vertical" ECC that employs a single memory device, because the completed ECC codeword (data+ECC redundancy) is not $2^N$ in size. As a consequence, the data area of the physical memory can be contiguous and addressed with no address translation. Knowing that the data address is un-translated and that all data bytes are contiguous has various benefits including easier debugging at the hardware level and simpler implementation in using software debugger tools to display blocks of memory. This design also reduces latency clock cycles for pipelining address translation logic for the data address. The ECC address is accessed after the data address, and thus, has many clock cycles before use and can afford pipelining latency for high frequency performance. In addition, as discussed above, this implementation allows for a design with improved performance by overlapping the data and ECC command operations, since the ECCs now reside in separate banks from the corresponding data.

Figure 11:
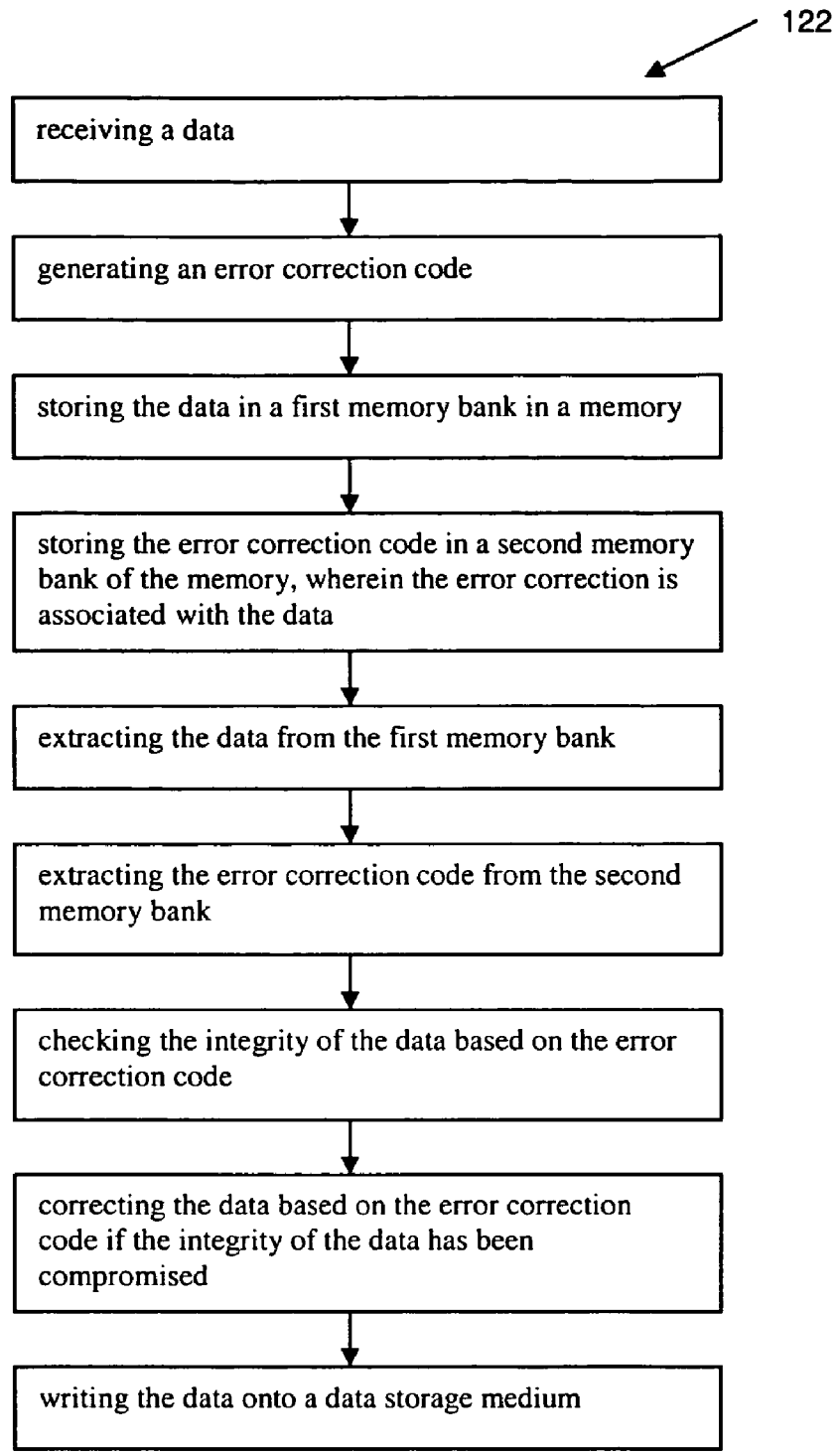
FIG. 11 is a flow chart illustrating one example of a method for data buffering by storing data and their associated ECC in separate banks.

As discussed above, the process of separation of data and ECC into two or more banks in the RAM can be implemented as methods for buffering and transferring data between devices and/or components. An example of the method 122 is described in FIG. 11.

This invention has been described and specific examples of the invention have been portrayed. While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. Therefore, to the extent there are variations of the invention, which are within the spirit of the disclosure or equivalent to the inventions found in the claims, it is the intent that this patent will cover those variations as well. Finally, all publications and patent applications cited in this specification are herein incorporated by reference in their entirety as if each individual publication or patent application were specifically and individually put forth herein.

What is claimed is:

1. A memory apparatus comprising:
a tape drive comprising:
a memory controller operable to receive data and generate an error correction code for the data and to buffer said data between a host computer and the tape drive; and
a memory including a first memory bank and a second memory bank, wherein the memory controller is further operable to store the data in the first memory bank, store the error correction code in the second memory bank, receive a first address, and store the data in the first memory bank at a location that corresponds to the first address, wherein the data is stored in a contiguous manner in the first memory bank, and wherein the memory controller is operable to generate a second address by translating the first address, and store the error correction code in the second memory bank at a location that corresponds to the second address.

2. The memory apparatus according to claim 1, wherein the memory comprises four banks, with two of the four banks having error correction code storage regions.

3. The memory apparatus according to claim 2, wherein the total size of the memory has a value S, and the ratio between number of bytes of the data and the number of bytes of the error correction code is a value R, the four banks comprise bank 1, bank 2, bank 3 and bank 4, and if the first address results in storage of the data in either bank 1 or bank 2, then the second address is determined by the following equation [(first address−S/(R*2))/ R]+[S S/(R*2)], and if the first address results in storage of the data in either bank 3 or bank 4, then the second address is determined by the following equation [(first address−(S12))/R].

4. The memory apparatus according to claim 1, wherein a polynomial is used to generate the error correction code.

5. The memory apparatus according to claim 4, wherein the polynomial consists of X16+X15+X11+X10+X6+X4+X3+1.

6. The memory apparatus according to claim 1, wherein the memory controller is operable to perform a contiguous transfer into the memory of the data and its associated error correction code.

7. The memory apparatus according to claim 1, wherein the memory controller is operable to generate an address for transfer of the error correction code onto the memory while simultaneously perform the transfer of data onto the memory.

8. The memory apparatus according to claim 1, wherein the memory controller is operable to perform a closing of the first memory bank while simultaneously perform a transfer of the error correction code into the second memory bank.

9. The memory apparatus according to claim 1, further comprises a transducer operable to receive the data from the memory controller and store the data in a data storage medium.

10. The memory apparatus according to claim 9, wherein the data storage medium is selected from a group consisting of magnetic tape, writable CD, rewritable CD, writable DVD, rewritable DVD, and hard drive.

11. The memory apparatus according to claim 9, wherein the memory controller is further operable to extract the data from the first memory bank, extract the error correction code from the second memory bank, and use the error correction code to determine if the extracted data includes an error.

12. The memory apparatus according to claim 11, wherein the memory controller is further operable to correct the error based on the error correction code.

13. The memory apparatus according to claim 12, wherein the memory comprises a DDR memory.

14. The memory apparatus according to claim 13, wherein the error correction code comprises double error correcting/triple error detecting code.

15. The memory apparatus according to claim 11, wherein the data storage medium comprises a magnetic data storage tape.

16. The memory apparatus according to claim 15, wherein the error correction code comprises single error correcting/double error detecting code.

17. The memory apparatus according to claim 1, wherein the data consists of 32 bytes and the error correction code consists of 2 bytes.

18. The memory apparatus according to claim 1, wherein the memory comprises a DDR memory.

19. The memory apparatus according to claim 1, wherein the error correction code comprises Hamming code.

20. The memory apparatus according to claim 1, wherein the error correction code comprises BCH code.

21. The memory apparatus according to claim 1, further comprising:
a computer operable to receive the data from the memory.

22. The memory apparatus according to claim 21, wherein the memory controller is further operable to extract the data from the first memory bank, extract the error correction code from the second memory bank, check the integrity of the data based on the error correction code, and transfer the data to the computer.

23. The memory apparatus according to claim 22, further comprises a transducer operable to read the data from a data storage medium and transfer the data to the memory controller.

24. The memory apparatus according to claim 23, wherein the memory comprises a DDR memory.

25. The memory apparatus according to claim 24, wherein the data storage medium comprises a magnetic tape.

26. The memory apparatus according to claim 1, wherein the memory controller is further operable to extract the data from the first memory bank, extract the error correction code from the second memory bank, verify integrity of the data based on the error correction code.

27. The memory apparatus according to claim 26, wherein the memory controller is further operable to correct an error in the data based on the error correction code.

* * * * *